United States Patent
Koshimizu et al.

(10) Patent No.: US 10,312,144 B2
(45) Date of Patent: Jun. 4, 2019

(54) METHOD OF DIVIDING A WAFER BY BACK GRINDING

(71) Applicant: DISCO CORPORATION, Tokyo (JP)

(72) Inventors: Hideki Koshimizu, Tokyo (JP); Yurika Araya, Tokyo (JP); Tetsukazu Sugiya, Tokyo (JP); Takashi Haimoto, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/456,800

(22) Filed: Mar. 13, 2017

(65) Prior Publication Data
US 2017/0271208 A1    Sep. 21, 2017

(30) Foreign Application Priority Data
Mar. 17, 2016    (JP) .................................. 2016-054223

(51) Int. Cl.
*H01L 21/00*    (2006.01)
*H01L 21/78*    (2006.01)
*H01L 23/544*    (2006.01)

(52) U.S. Cl.
CPC ............ *H01L 21/78* (2013.01); *H01L 23/544* (2013.01); *H01L 2223/54453* (2013.01)

(58) Field of Classification Search
CPC .................. H01L 21/78; H01L 23/544; H01L 2223/54453
USPC ........................................................ 438/462
See application file for complete search history.

(56) References Cited

U.S. PATENT DOCUMENTS

| | | | |
|---|---|---|---|
| 9,716,040 B2 * | 7/2017 | Haimoto | H01L 21/78 |
| 2004/0113283 A1 * | 6/2004 | Farnworth | H01L 21/3043 257/782 |
| 2005/0090077 A1 * | 4/2005 | Nagai | B23K 26/0057 438/464 |
| 2006/0154447 A1 * | 7/2006 | Kushima | H01L 21/78 438/460 |
| 2007/0007472 A1 * | 1/2007 | Genda | B23K 26/0736 250/548 |
| 2008/0233712 A1 * | 9/2008 | Sekiya | H01L 21/6835 438/462 |
| 2009/0209066 A1 * | 8/2009 | Sekiya | H01L 21/67132 438/114 |

(Continued)

FOREIGN PATENT DOCUMENTS

| | | |
|---|---|---|
| JP | 2000-182995 | 6/2000 |
| JP | 2002-118081 | 4/2002 |
| JP | 2006-294913 | 10/2006 |

*Primary Examiner* — Anthony Ho
*Assistant Examiner* — Mohammad M Hoque
(74) *Attorney, Agent, or Firm* — Greer Burns & Crain, Ltd.

(57) ABSTRACT

A wafer processing method for divides a wafer into individual device chips along a plurality of division lines. The method includes forming a dividing groove along each division line formed on the front side of the wafer, the dividing groove having a depth corresponding to the finished thickness of each device chip, thinning the wafer to expose the dividing groove to the back side of the wafer, thereby dividing the wafer into the individual device chips, applying a liquid resin for die bonding to the back side of the wafer and next solidifying the liquid resin applied to the back side of the wafer, thereby forming a die bonding resin film having a predetermined thickness on the back side of each device chip, and isolating each device chip from the wafer.

10 Claims, 5 Drawing Sheets

(56) References Cited

U.S. PATENT DOCUMENTS

2011/0263097 A1\* 10/2011 Yoshimura .......... H01L 21/6836
  438/463
2014/0315372 A1\* 10/2014 Nakamura .......... H01L 21/6836
  438/462

\* cited by examiner

METHOD OF DIVIDING A WAFER BY BACK GRINDING

BACKGROUND OF THE INVENTION

Field of the Invention

The present invention relates to a wafer processing method for dividing a wafer to obtain a plurality of device chips each having a die bonding resin film on the back side.

Description of the Related Art

In a manufacturing process for semiconductor device chips to be used for integrated circuits (ICs), large-scale integrations (LSIs), etc., a wafer having a plurality of devices is divided into individual device chips, wherein the plural devices are formed on the front side of the wafer so as to be separated from each other by a plurality of division lines, thus obtaining the semiconductor device chips, which are next packaged to be used in electrical equipment such as mobile phones and personal computers.

Each semiconductor device chip is bonded to a lead frame (metal substrate) or the like. A bonding agent for bonding each semiconductor device chip to the lead frame is provided on the back side of each semiconductor device chip in the following manner. A die attach film (DAF as a film functioning both as a dicing tape and as a bonding agent) is attached to the back side of a wafer to be divided into the individual device chips, wherein the DAF has substantially the same size as that of the wafer. Thereafter, the wafer is divided into the individual device chips by dicing from the front side of the wafer, and the DAF is also cut according to the individual device chips. Thereafter, each device chip with the DAF attached to the back side is isolated from the wafer, thus obtaining each semiconductor device chip with the bonding agent provided on the back side (see Japanese Patent Laid-open No. 2000-182995, for example).

The bonding agent providing method mentioned above is performed on the following precondition. That is, the back side of the wafer is ground to reduce the thickness of the wafer to a predetermined thickness. Thereafter, the DAF is attached to the back side of the wafer. Thereafter, the wafer is divided into the individual device chips by dicing the front side of the wafer.

However, in the case of adopting a so-called dicing-before-grinding method such that dicing is first performed by using a cutting blade to cut the front side of the wafer and thereby form a dividing groove having a depth corresponding to the finished thickness of each device chip, and the back side of the wafer is next ground until the dividing groove is exposed to the back side of the wafer, thereby dividing the wafer into the individual device chips, it is difficult to adopt the bonding agent providing method mentioned above. That is, when the back grinding step is completed in the dicing-before-grinding method, the wafer is divided into the individual device chips. To cope with this problem, there has been proposed another method of providing a bonding agent such as a die bonding resin on the back side of each device chip in the case of adopting the dicing-before-grinding method. In this bonding agent providing method, a die bonding resin film is attached to the whole back side of a wafer after dividing the wafer into individual device chips and before isolating each device chip from the wafer. Thereafter, a laser beam is applied to the die bonding resin film from the front side of the wafer through each dividing groove, thereby dividing the die bonding resin film according to the device chips (see Japanese Patent Laid-open No. 2002-118081, for example). Further, as the method of forming the dividing groove having a depth corresponding to the finished thickness of each device chip along each division line, etching may be adopted in place of a cutting blade (see Japanese Patent Laid-open No. 2006-294913, for example).

SUMMARY OF THE INVENTION

In the above method of providing a die bonding resin by using the dicing-before-grinding method, the die bonding resin film attached to the back side of the wafer must be cut separately from the division of the wafer, causing relatively complicated steps. Further, after grinding the back side of the wafer to divide the wafer into the individual device chips, there is a possibility that each division line of the wafer may be changed in width or position by a load applied from a grinder in performing the back grinding step, causing a loss of linearity. Accordingly, it may be difficult to linearly process each division line by using any physical processing means such as a cutting blade. Particularly, in the case that each device is small in size (e.g., 2 mm square or less), the number of devices to be divided from the wafer is large, so that the physical processing along each division line may become more difficult to cause a reduction in productivity.

It is therefore an object of the present invention to provide a wafer processing method which can provide a die bonding resin on the back side of each device chip to be isolated from a wafer without a reduction in productivity in the case of adopting the dicing-before-grinding method.

In accordance with an aspect of the present invention, there is provided a wafer processing method for dividing a wafer into individual device chips along a plurality of crossing division lines, the front side of the wafer being partitioned by the division lines to define a plurality of separate regions where a plurality of devices corresponding to the device chips are formed, the wafer processing method including a dividing groove forming step of forming a dividing groove along each division line formed on the front side of the wafer, the dividing groove having a depth corresponding to the finished thickness of each device chip; a dividing step of providing a protective member on the front side of the wafer after performing the dividing groove forming step, and next thinning the wafer to expose the dividing groove to the back side of the wafer, thereby dividing the wafer into the individual device chips; a die bonding resin film forming step of applying a liquid resin for die bonding to the back side of the wafer after performing the dividing step, and next solidifying the liquid resin applied to the back side of the wafer, thereby forming a die bonding resin film having a predetermined thickness on the back side of each device chip; and an isolating step of isolating each device chip from the wafer after performing the die bonding resin film forming step; the die bonding resin film forming step including a thin film layer forming step of spraying the liquid resin to the back side of the wafer to thereby form a thin film layer on the back side of the wafer, and an external stimulus applying step of applying an external stimulus to the thin film layer to thereby solidify the thin film layer; the thin film layer forming step and the external stimulus applying step being repeated alternately two or more times to thereby form the die bonding resin film having the predetermined thickness.

Preferably, the dividing groove forming step is performed by using a cutting blade to cut the wafer along each division line. As a modification, the dividing groove forming step may be performed by subjecting the wafer to wet etching or dry etching. As another modification, the dividing groove forming step may be performed by applying a laser beam to the wafer along each division line. By adopting any one of these methods, the dividing groove can be formed along each division line. Preferably, the dividing step is performed by grinding the back side of the wafer to thereby reduce the thickness of the wafer until the dividing groove is exposed to the back side of the wafer.

Preferably, the isolating step includes a transfer step of attaching an adhesive tape to the back side of the wafer after performing the die bonding resin film forming step, supporting the wafer through the adhesive tape to an annular frame having an inside opening in such a manner that the wafer is set in the inside opening closed by the adhesive tape, and next removing the protective member from the front side of the wafer, a tape expanding step of expanding the adhesive tape after performing the transfer step, and a pickup step of picking up each device chip from the adhesive tape after performing the tape expanding step.

Preferably, the thin film layer forming step includes a holding step of holding the wafer on a rotatable table in the condition where the back side of the wafer is exposed, and a coating step of rotating the rotatable table holding the wafer thereon and next spraying the liquid resin to the back side of the wafer.

Preferably, the liquid resin to be sprayed in the thin film layer forming step includes an ultraviolet curing resin, and the external stimulus to be applied in the external stimulus applying step includes ultraviolet light. As a modification, the liquid resin to be sprayed in the thin film layer forming step includes a thermosetting resin, and the external stimulus to be applied in the external stimulus applying step includes heat. Preferably, the thin film layer to be formed once in the thin film layer forming step has a thickness of 3 to 7 µm, and the predetermined thickness of the die bonding resin film is 30 to 50 µm.

According to the wafer processing method of the present invention, the liquid resin for die bonding can be applied to the back side of each device chip divided from the wafer, so that the die bonding resin film can be formed on the back side of each device chip. Accordingly, even in the case of obtaining the individual device chips by the dicing-before-grinding method, it is unnecessary to perform a step of dividing a DAF according to the device chips by applying a laser beam, for example. Accordingly, the productivity can be improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
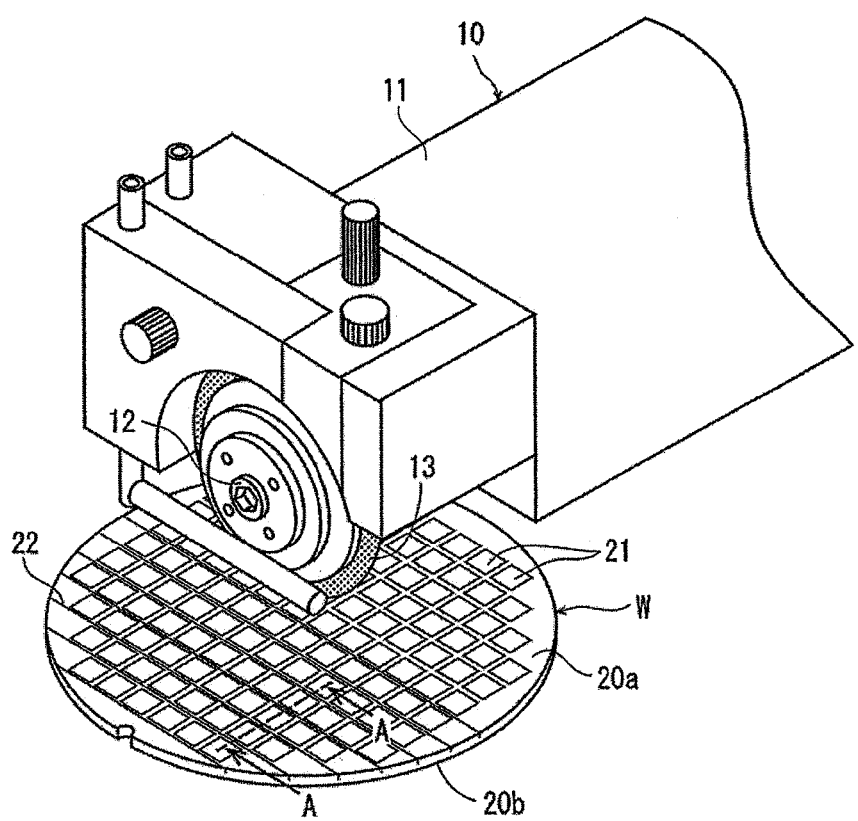
FIG. 1A is a perspective view showing an essential part of a cutting apparatus for performing a dividing groove forming step.

A preferred embodiment of the wafer processing method according to the present invention will now be described in detail with reference to the attached drawings. FIG. 1A shows a dividing groove forming step of forming a dividing groove along each division line formed on the front side of a semiconductor wafer W as a workpiece, wherein the dividing groove has a depth corresponding to the finished thickness of each device chip.

Figure 1B:
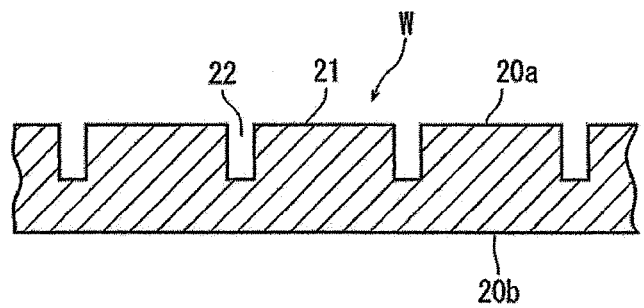
FIG. 1B is a cross section taken along the line A-A in FIG. 1A.

As shown in FIG. 1A, the dividing groove forming step is performed by using a cutting apparatus (a part of which being shown) having a spindle unit 10. The spindle unit 10 includes a spindle housing 11 and a spindle 12 rotatably mounted in the spindle housing 11, wherein a front end portion of the spindle 12 projects from the spindle housing 11 and a cutting blade 13 is fixed to the front end portion of the spindle 12. The semiconductor wafer W has a predetermined thickness (e.g., 700 µm) in its initial condition. The semiconductor wafer W has a front side 20a and a back side 20b. A plurality of crossing division lines are formed on the front side 20a of the semiconductor wafer W to thereby define a plurality of separate regions where a plurality of devices 21 are formed. In performing the dividing groove forming step, the semiconductor wafer W is held under suction on a holding table (not shown) included in the cutting apparatus in the condition where the back side 20b of the semiconductor wafer W is in contact with the upper surface of the holding table. Thereafter, the cutting blade 13 fixed to the spindle 12 is rotated at a high speed and then lowered to cut in the semiconductor wafer W. Thereafter, the holding table and the cutting blade 13 are relatively moved in a feeding direction to thereby form a dividing groove 22 along each division line as shown in FIG. 1B, which is a cross section taken along the line A-A in FIG. 1A. The dividing groove 22 along each division line has a depth corresponding to the finished thickness (e.g., 50 µm) of each device chip. Further, the dividing groove 22 has a predetermined width (e.g., 30 µm). In FIG. 1B, the dividing groove 22 is so shown as to be emphasized for convenience of illustration and not in accordance with an actual size.

In the cutting apparatus, the cutting blade 13 is movable in a feeding direction as a direction of cutting the semiconductor wafer W and also movable in an indexing direction perpendicular to the feeding direction in a horizontal plane. The cutting blade 13 is further vertically movable with respect to the semiconductor wafer W. The movement of the cutting blade 13 in each direction can be controlled in accordance with a program previously stored. In this manner, the dividing groove 22 is formed along each division line formed on the front side 20a of the semiconductor wafer W by using the cutting blade 13. Thus, the dividing groove forming step using the cutting blade 13 is completed. Thereafter, the semiconductor wafer W is removed from the holding table of the cutting apparatus. While the depth of each dividing groove 22 is set to a value corresponding to the finished thickness of each device chip, it is not necessarily required to set the depth of each dividing groove 22 to a value exactly coinciding with the finished thickness of each device chip, but the depth of each dividing groove 22 may be set to a value such that when the back side 20b of the semiconductor wafer W is ground to reduce the thickness of the wafer W to the predetermined finished thickness in the subsequent step, the semiconductor wafer W is divided into the individual device chips along each dividing groove 22. For example, the depth of each dividing groove 22 may be set to a value slightly greater than the predetermined finished thickness.

Figure 2A:
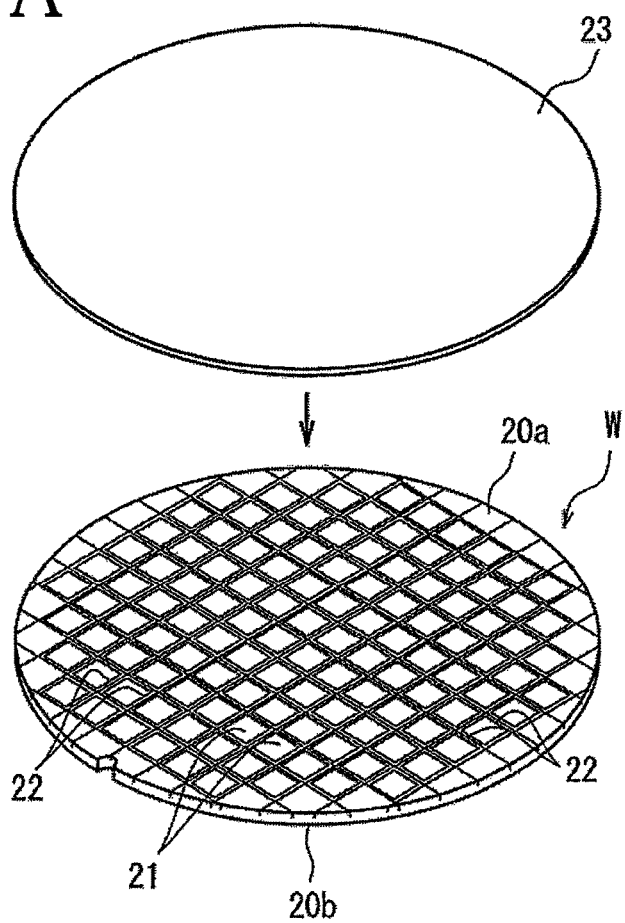
FIGS. 2A and 2B are perspective views showing a step of attaching a protective member to the front side of a wafer.
Figure 2B:
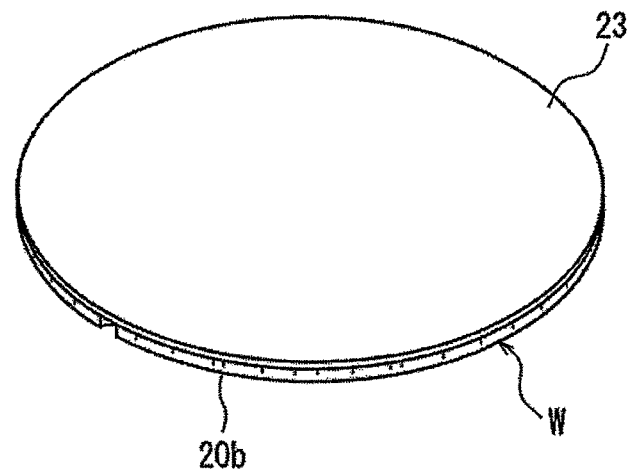

After performing the dividing groove forming step, a protective tape 23 as a protective member for protecting the devices 21 is attached to the front side 20a of the semiconductor wafer W as shown in FIGS. 2A and 2B (protective member attaching step). The protective member attaching step is followed by a dividing step of dividing the semiconductor wafer W into the individual device chips as described below.

Figure 3A:
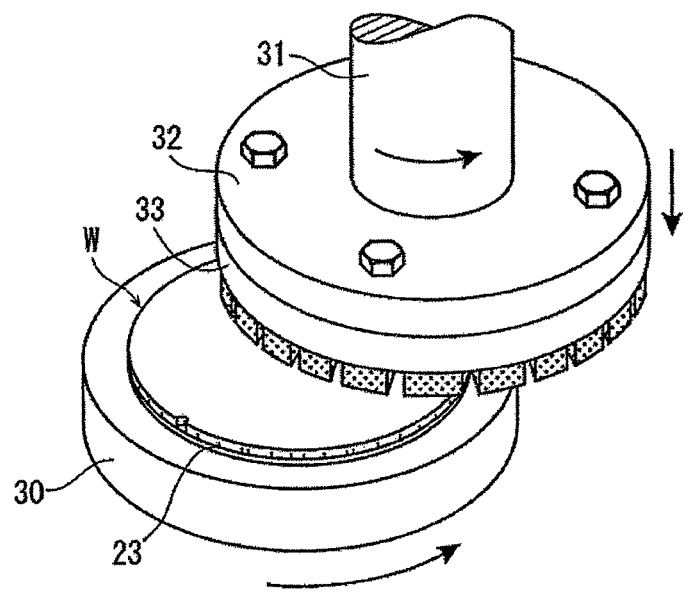
FIGS. 3A and 3B are perspective views showing a dividing step of grinding the back side of the wafer to thereby divide the wafer into device chips.
Figure 3B:
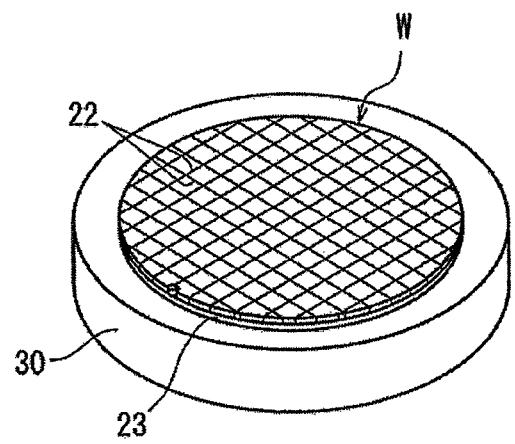

This dividing step will now be described with reference to FIGS. 3A and 3B. As shown in FIG. 3A, the dividing step is performed by using a grinding apparatus (a part of which being shown) having a chuck table 30. In performing the dividing step, the semiconductor wafer W with the protective tape 23 attached to the front side is held on the chuck table 30 in the condition where the protective tape 23 is in contact with the upper surface of the chuck table 30. More specifically, the chuck table 30 is rotatable by a motor (not shown). The chuck table 30 has an upper surface as a holding surface formed of porous ceramic having fine pores allowing passage of air. The upper surface of the chuck table 30 is in communication with suction means (not shown). Accordingly, when the suction means is operated, the semiconductor wafer W placed on the upper surface of the chuck table 30 is held under suction.

The grinding apparatus further includes a spindle 31 adapted to be rotated by a servo motor (not shown). The spindle 31 is provided above the chuck table 30 so that the axis of the spindle 31 is shifted from the center of the chuck table 30. A mounter 32 is formed at the lower end of the spindle 31. A grinding wheel 33 is firmly fixed to the mounter 32 by means of bolts. The grinding wheel 33 has a plurality of abrasive members for grinding the semiconductor wafer W held on the chuck table 30. The spindle 31, the mounter 32, the grinding wheel 33, and the servo motor constitute a grinding unit. The grinding apparatus further includes feeding means (not shown) for moving the grinding unit in a vertical direction, or in a feeding direction.

The feeding means is operated to lower the grinding wheel 33 until the abrasive members come into contact with the semiconductor wafer W held on the chuck table 30. At this time, the chuck table 30 is rotated at 300 rpm, for example, and the grinding wheel 33 is rotated at 6000 rpm, for example. Thereafter, the grinding wheel 33 is fed downward at a rate of 1 μm/second. At this time, the thickness of the semiconductor wafer W is measured by a contact type or noncontact type thickness gauge (not shown). When the thickness of the semiconductor wafer W is reduced to a predetermined finished thickness (e.g., 50 μm), the dividing grooves 22 formed in the dividing groove forming step are exposed to the back side 20b of the semiconductor wafer W as shown in FIG. 3B, so that the semiconductor wafer W is divided into the individual device chips. In the condition where the semiconductor wafer W is divided into the individual device chips, the protective tape 23 as the protective member remains attached to the front side of each device chip. Thus, the dividing step using the grinding apparatus is completed.

Figure 4A:
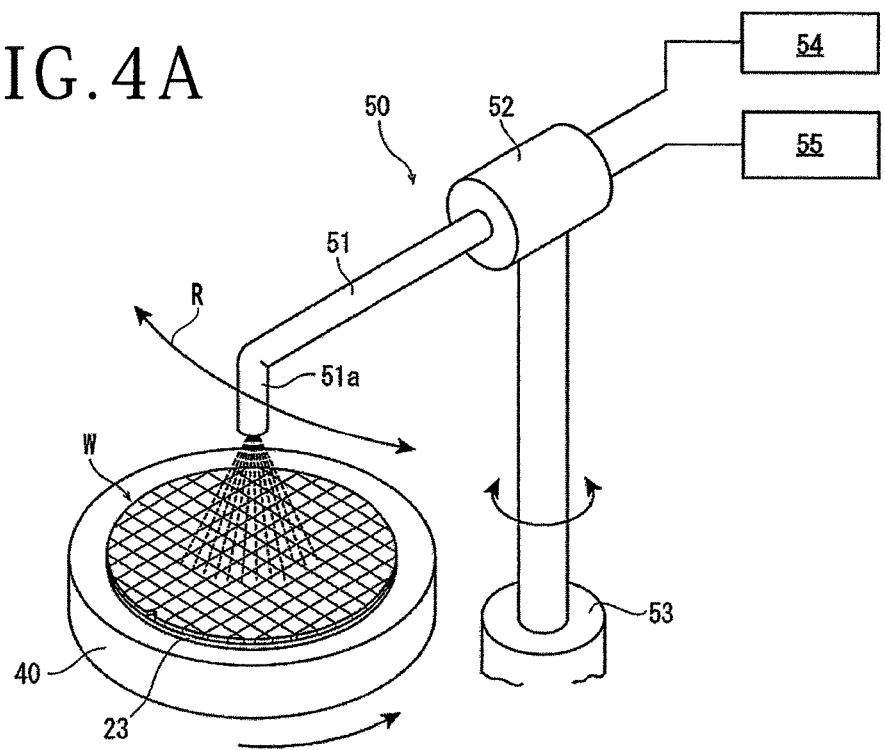
FIG. 4A is a perspective view showing a step of applying a liquid resin for die bonding to the back side of the wafer.
Figure 4B:
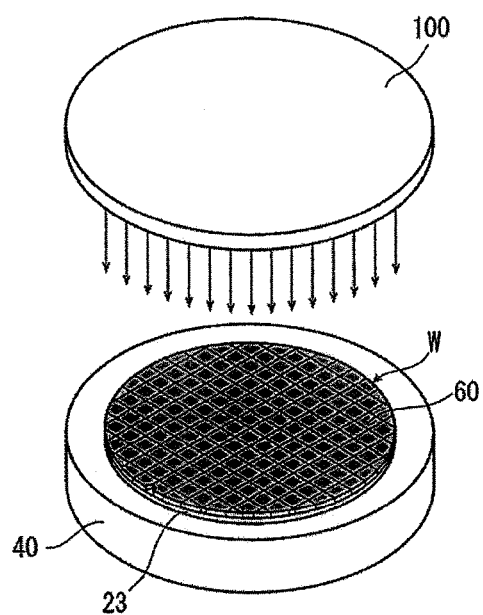
FIG. 4B is a perspective view showing a step of applying ultraviolet light to the liquid resin applied to the back side of the wafer.

After performing the dividing step, a die bonding resin film forming step is performed by using a die bonding resin film forming apparatus as shown in FIGS. 4A and 4B, wherein a part of this resin film forming apparatus is shown. In performing the die bonding resin film forming step, the semiconductor wafer W divided into the individual device chips and attached to the protective tape 23 is held on a holding table 40 included in the resin film forming apparatus in the condition where the back side of the semiconductor wafer W is oriented upward, that is, the protective tape 23 is in contact with the upper surface of the holding table 40. As similar to the chuck table 30 of the grinding apparatus shown in FIG. 3A, the holding table 40 is connected to suction means (not shown) for effecting suction holding of the semiconductor wafer W on the upper surface of the holding table 40. Further, the holding table 40 is rotatable by a servo motor (not shown).

As shown in FIG. 4A, the resin film forming apparatus includes a coating unit 50 provided in the vicinity of the holding table 40. After holding the semiconductor wafer W on the holding table 40 as mentioned above, a thin film layer forming step is performed by the coating unit 50. The coating unit 50 includes a coating nozzle 51 extending substantially horizontally and having a front end 51a adapted to be positioned above the semiconductor wafer W held on the holding table 40 during the operation, a mixing unit 52 for mixing a liquid resin for die bonding and a high-pressure air and then supplying the resultant mixture to the coating nozzle 51, a swinging unit 53 having an air motor (not shown) for swinging the coating nozzle 51 in the direction shown by an arrow R in FIG. 4A in a horizontal plane parallel to the upper surface of the semiconductor wafer W, a high-pressure air tank 54 for supplying a high-pressure air to the mixing unit 52, and a liquid resin tank 55 for supplying a liquid resin for die bonding to the mixing unit 52.

The high-pressure air tank 54 is provided with an air pump and a relief valve (both not shown), so that the pressure in the tank 54 is always controlled to a constant pressure (e.g., 0.3 MPa) during the operation, and a high-pressure air can be supplied to the mixing unit 52 as required. Further, the liquid resin tank 55 contains a liquid resin for die bonding, which functions as a bonding agent. This resin is normally in a liquid state and it is solidified by applying an external stimulus. The liquid resin tank 55 has a built-in pump for supplying the liquid resin under a constant pressure to the mixing unit 52. In this preferred embodiment, an ultraviolet curing resin curable by applying ultraviolet light as the external stimulus is used as the liquid resin. For example, the ultraviolet curing resin may be provided by "HP20VL" or "ST20VL" manufactured by Honghow Specialty Chemicals Inc. As another example of the liquid resin, a silver filled epoxy resin as a thermosetting resin curable by applying predetermined heat as the external stimulus, (by heating) may be used. For example, the silver filled epoxy resin may be provided by "Ablebond 8200C" manufactured by Ablestik Laboratories.

The mixing unit 52 has a restricted portion (not shown) through which the high-pressure air is passed. This restricted portion is provided with a thin pipe for supplying the liquid resin in a direction perpendicular to the axial direction of the restricted portion. Thus, a so-called venturi structure is provided in the mixing unit 52. In the case of spraying the liquid resin from the front end 51a of the coating nozzle 51, the high-pressure air is supplied from the high-pressure air tank 54 to the mixing unit 52, and the liquid resin is supplied from the liquid resin tank 55 to the mixing unit 52. When the high-pressure air is passed through the restricted portion of the mixing unit 52, the liquid resin is sucked from the thin pipe into the restricted portion by a venturi effect. At this time, the liquid resin is atomized in the restricted portion and then sprayed from the front end 51a of the coating nozzle 51 toward the back side of the semiconductor wafer W. The structure of the mixing unit 52 is not limited in the present invention. For example, the configuration of an air brush or the like to be generally used as a coating tool may be applied.

The thin film layer forming step of spraying the liquid resin from the coating nozzle 51 toward the back side of the semiconductor wafer W will now be described in more detail. When the semiconductor wafer W is held on the holding table 40, the coating unit 50 is set in a standby condition. That is, the front end 51a of the coating nozzle 51 is positioned above the outside of the semiconductor wafer W in the vicinity thereof. The reason for this setting is to prevent that a large-diameter drop of the liquid resin may be applied on the semiconductor wafer W at starting the coating operation. In the case of spraying the liquid resin from the coating nozzle 51, the holding table 40 starts to be rotated at 500 rpm, for example. Thereafter, the high-pressure air starts to be supplied from the high-pressure air tank 54, and the liquid resin next starts to be supplied from the liquid resin tank 55. In the condition where the front end 51a of the coating nozzle 51 is positioned above the outside of the semiconductor wafer W, the liquid resin starts to be sprayed from the front end 51a of the coating nozzle 51, and the swinging unit 53 next starts to be operated. That is, during the rotation of the semiconductor wafer W at the above speed, the coating nozzle 51 is driven by the swinging unit 53 so that the front end 51a of the coating nozzle 51 is reciprocated above the semiconductor wafer W as shown by the arrow R by preset plural times (e.g., five times). Thereafter, the front end 51a of the coating nozzle 51 is returned to the initial position (standby condition) above the outside of the semiconductor wafer W. Thereafter, the supply of the liquid resin and the supply of the high-pressure air are stopped. Further, the rotation of the holding table 40 is also stopped to complete the thin film layer forming step. As described above, the front end 51a of the coating nozzle 51 is reciprocated plural times, e.g., five times, to apply a small amount of liquid resin in each pass rather than apply a large amount of liquid resin at a time. As a result, a thin film layer having a thickness of 3 to 7 μm can be formed from the liquid resin on the back side of the semiconductor wafer W in the above thin film layer forming step.

After completing the thin film layer forming step, an external stimulus applying step is performed by using ultraviolet light applying means 100 as shown in FIG. 4B. That is, the ultraviolet light applying means 100 functions as means for applying an external stimulus to the thin film layer. As shown in FIG. 4B, ultraviolet light is applied from the ultraviolet light applying means 100 to the thin film layer formed on the back side of the semiconductor wafer W. As a result, the thin film layer is solidified to obtain a die bonding resin film 60 on the back side of the semiconductor wafer W divided into the individual device chips as shown in FIG. 4B.

In the present invention, the set of the thin film layer forming step and the external stimulus applying step mentioned above is repeated two or more times. More specifically, as described above, the liquid resin for die bonding is sprayed to the back side of the semiconductor wafer W to form the thin film layer having a thickness of 3 to 7 μm. Thereafter, ultraviolet light is applied to the thin film layer, thereby solidifying the thin film layer. Thereafter, the thin film layer forming step and the external stimulus applying step are performed again. Thus, the set of the thin film layer forming step and the external stimulus applying step is repeated two or more times to obtain a die bonding resin film having a predetermined thickness (e.g., 30 to 50 μm). Thus, the die bonding resin film forming step is completed. In the case of using a thermosetting resin as the liquid resin for die bonding in the thin film layer forming step, heat is applied from an electric heater or the like to the thin film layer in place of the ultraviolet light used above in performing the external stimulus applying step. Also in this case, the thin film layer formed of the thermosetting resin is solidified by heating to thereby obtain a similar die bonding resin film 60 on the back side of the semiconductor wafer W divided into the individual device chips.

As described above, the liquid resin for die bonding is sprayed to the back side of the semiconductor wafer W previously divided into the individual device chips, and the thin film layer formed on the back side of the semiconductor wafer W is next solidified. Then, such a series of steps is repeated two or more times to obtain the die bonding resin film having a predetermined thickness. With this configuration, the liquid resin is prevented from entering the dividing grooves 22 each having a width of 30 μm, for example, formed in the dividing groove forming step, each dividing groove 22 being present between any adjacent device chips. That is, the liquid resin remains only on the back side of each device chip. In other words, after dividing the semiconductor wafer W into the individual device chips by a dicing-before-grinding method, it is unnecessary to perform a step of dividing the die bonding resin film along the grooves formed on the semiconductor wafer W in performing the die bonding resin film forming step.

Figure 5:
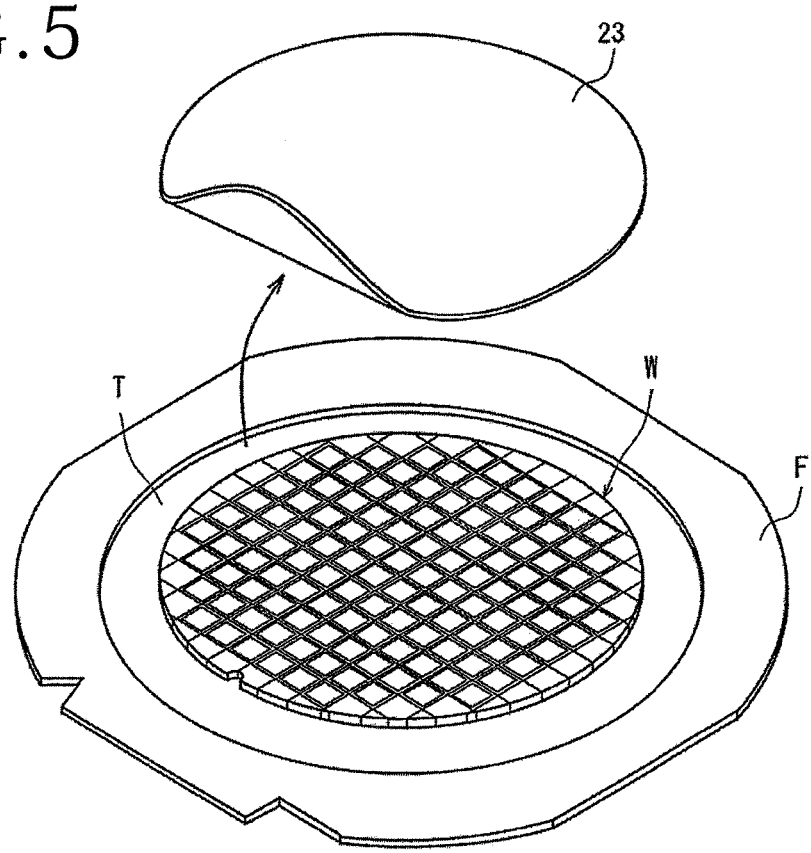
FIG. 5 is a perspective view showing a transfer step of supporting the wafer through an adhesive tape to an annular frame and then peeling the protective member.

After completing the die bonding resin film forming step, a transfer step is performed as shown in FIG. 5. In the semiconductor wafer W processed by the die bonding resin film forming step, the liquid resin for die bonding is not present in each dividing groove 22, so that the individual device chips are connected by only the protective tape 23. In performing the transfer step, the semiconductor wafer W is removed from the holding table 40 of the resin film forming apparatus shown in FIGS. 4A and 4B. Thereafter, as shown in FIG. 5, the back side of the semiconductor wafer W on which the die bonding resin film 60 has been formed is attached to an expandable adhesive tape T supported at its peripheral portion to an annular frame F having an inside opening in such a manner that the semiconductor wafer W is set in the inside opening closed by the adhesive tape T. Thereafter, the protective tape 23 is peeled from the front side of the semiconductor wafer W. Thus, the transfer step of transferring the semiconductor wafer W from the protective tape 23 to the adhesive tape T is completed, so that the semiconductor wafer W with the die bonding resin film 60 formed on the back side is supported through the adhesive tape T to the annular frame F.

Figure 6:
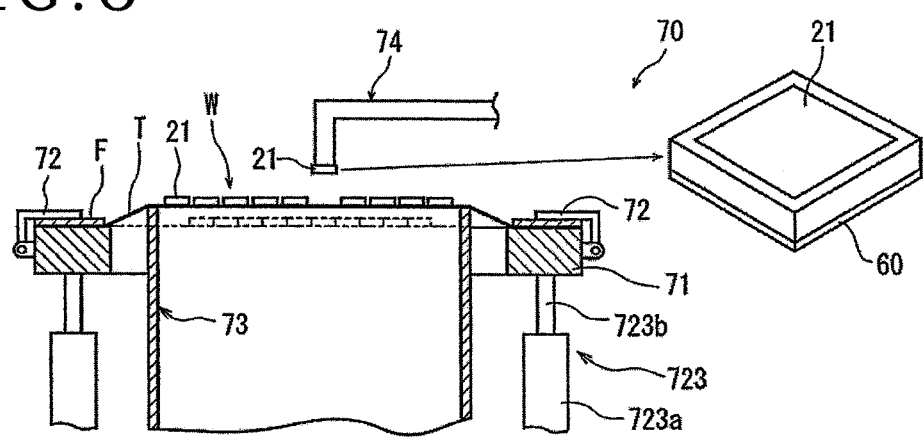
FIG. 6 is a sectional view showing an isolating step of isolating each device chip from the wafer.

After completing the transfer step, an isolating step is performed in such a manner that each device chip having the die bonding resin film 60 on the back side is isolated from the semiconductor wafer W. This isolating step is performed by using an isolating apparatus 70 as shown in FIG. 6, wherein a part of the isolating apparatus 70 is shown. The isolating apparatus 70 includes a frame holding member 71 having an upper surface for mounting the annular frame F, a plurality of clamps 72 for clamping the annular frame F mounted on the upper surface of the frame holding member 71, and a cylindrical expanding drum 73 provided inside the frame holding member 71 for expanding the adhesive tape T supported to the annular frame F. The expanding drum 73 has an upper opening. The frame holding member 71 is vertically movably supported by supporting means 723. The supporting means 723 is composed of a plurality of air cylinders 723a arranged around the expanding drum 73 and a plurality of piston rods 723b extending from the air cylinders 723a. Each piston rod 723b is connected to the frame holding member 71.

The expanding drum 73 has a diameter smaller than the inner diameter of the annular frame F and larger than the diameter of the semiconductor wafer W supported through the adhesive tape T to the annular frame F. The frame holding member 71 is adapted to be vertically moved by the supporting means 723 between a reference position (shown by a phantom line in FIG. 6) where the upper surface of the frame holding member 71 is at substantially the same level as the upper end of the expanding drum 73 and an expansion position (shown by a solid line in FIG. 6) where the upper surface of the frame holding member 71 is lower in level than the upper end of the expanding drum 73. That is, in the expansion position, the upper end of the expanding drum 73 is higher in level than the upper surface of the frame holding member 71.

When the frame holding member 71 is lowered from the reference position to the expansion position, the upper end of the expanding drum 73 is relatively changed in level from the lower position (reference position) shown by the phantom line to the higher position (expansion position) shown by the solid line. Accordingly, the adhesive tape T supported to the annular frame F comes into abutment against the upper end of the expanding drum 73 and is expanded. As a result, a tensile force radially acts on the semiconductor wafer W attached to the adhesive tape T, thereby increasing the spacing between the individual device chips already divided from each other along the dividing grooves 22 (tape expanding step). After performing the tape expanding step, a pickup step is performed by using a pickup collet 74 as shown in FIG. 6 in such a manner that each device chip is held under suction by the pickup collet 74 and then peeled from the adhesive tape T. Each device chip is next transferred to a tray (not shown) or any means for performing a die bonding step of bonding each device chip to a lead frame. Thus, the isolating step is completed and the wafer processing method of the present invention is then completed. There is a case that the liquid resin sprayed to the back side of the semiconductor wafer W in the thin film layer forming step may slightly enter the dividing grooves 22 previously formed on the semiconductor wafer W. However, by expanding the adhesive tape T in the isolating step, the semiconductor wafer W with the die bonding resin film can be completely divided into the individual device chips. Accordingly, there is no need for any dedicated cutting means or the like for dividing the semiconductor wafer W with the die bonding resin film.

In the dividing groove forming step mentioned above, the cutting blade 13 fixed to the front end of the spindle 12 is rotated to cut the front side 20a of the semiconductor wafer W, thereby forming the dividing groove 22 along each division line. However, the method of forming the dividing groove 22 is not limited to the above method in the present invention, but various other methods may be adopted. For example, as described in Japanese Patent Laid-open No. 2006-294913, dry etching such as reactive ion etching using a gas formed into ions and radicals by a plasma may be adopted, or wet etching using various liquids to be selected according to the material of a wafer may also be adopted. As another method, laser processing using a laser beam having an absorption wavelength to a wafer may also be adopted.

In the die bonding resin film forming step mentioned above, the liquid resin for die bonding is sprayed toward the back side of the semiconductor wafer W. At this time, the pressure of the high-pressure air to be supplied from the high-pressure air tank 54, the amount of the liquid resin to be supplied from the liquid resin tank 55, or the mixing ratio between the high-pressure air and the liquid resin in the mixing unit 52 is preferably set so that the particle size of the atomized liquid resin becomes small and the amount of the atomized liquid resin to be sprayed per unit time becomes small. If the particle size of the atomized liquid resin is large or the amount of the atomized liquid resin to be sprayed per unit time is large, there is a possibility that the liquid resin sprayed may enter the dividing grooves exposed to the back side of the semiconductor wafer W, so that an additional step of dividing the resin film may be required as in the prior art. Accordingly, the pressure of the high-pressure air having an effect on the particle size of the atomized liquid resin or the amount of the atomized liquid resin to be sprayed per unit time is preferably set so as to eliminate the possibility of entry of the liquid resin into the dividing grooves, in consideration of the width of each dividing groove and the viscosity of the liquid resin, for example.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into individual device chips along a plurality of crossing division lines, a front side of said wafer being partitioned by said division lines to define a plurality of separate regions where a plurality of devices corresponding to said device chips are formed, said wafer processing method comprising:

a dividing groove forming step of forming a dividing groove along each division line formed on the front side of said wafer, said dividing groove having a depth corresponding to the finished thickness of each device chip; followed by a dividing step of providing a protective member on the front side of said wafer after performing said dividing groove forming step, and next thinning said wafer to expose said dividing groove to a back side of said wafer, thereby dividing said wafer into said individual device chips; followed by a die bonding resin film forming step of applying a liquid resin for die bonding to the back side of said wafer after performing said dividing step, and next solidifying said liquid resin applied to the back side of said wafer, thereby forming a die bonding resin film having a predetermined thickness on the back side of each device chip; followed by an isolating step of isolating each device chip from said wafer after performing said die bonding resin film forming step;

said die bonding resin film forming step including a thin film layer forming step of spraying atomized liquid resin to the back side of said wafer by utilizing high-pressure air to thereby form a thin film layer on the back side of said wafer, and an external stimulus applying step of applying an external stimulus to said thin film layer to thereby solidify said thin film layer;

said thin film layer forming step and said external stimulus applying step being repeated alternately two or more times to thereby form said die bonding resin film having said predetermined thickness;

wherein the pressure of the high-pressure air and the amount of atomized liquid resin to be sprayed per unit of time is set so as to prevent entry of the liquid resin into the dividing grooves, in consideration of the width of each dividing groove and the viscosity of the liquid resin.

2. The wafer processing method according to claim 1, wherein said dividing groove forming step is performed by using a cutting blade to cut said wafer along each division line, thereby forming said dividing groove along each division line.

3. The wafer processing method according to claim 1, wherein said dividing groove forming step is performed by subjecting said wafer to wet etching or dry etching, thereby forming said dividing groove along each division line.

4. The wafer processing method according to claim 1, wherein said dividing groove forming step is performed by applying a laser beam to said wafer along each division line, thereby forming said dividing groove along each division line.

5. The wafer processing method according to claim 1, wherein said dividing step is performed by grinding the back side of said wafer to thereby reduce the thickness of said wafer until said dividing groove is exposed to the back side of said wafer.

6. The wafer processing method according to claim 1, wherein said isolating step includes:

a transfer step of attaching an adhesive tape to the back side of said wafer after performing said die bonding resin film forming step, supporting said wafer through said adhesive tape to an annular frame having an inside opening in such a manner that said wafer is set in said inside opening closed by said adhesive tape, and next removing said protective member from the front side of said wafer;

a tape expanding step of expanding said adhesive tape after performing said transfer step; and a pickup step of picking up each device chip from said adhesive tape after performing said tape expanding step.

7. The wafer processing method according to claim 1, wherein said thin film layer forming step includes:

a holding step of holding said wafer on a rotatable table in the condition where the back side of said wafer is exposed; and a coating step of rotating said rotatable table holding said wafer thereon and next spraying said liquid resin to the back side of said wafer.

8. The wafer processing method according to claim 1, wherein said liquid resin to be sprayed in said thin film layer forming step includes an ultraviolet curing resin, and said external stimulus to be applied in said external stimulus applying step includes ultraviolet light.

9. The wafer processing method according to claim 1, wherein said liquid resin to be sprayed in said thin film layer forming step includes a thermosetting resin, and said external stimulus to be applied in said external stimulus applying step includes heat.

10. The wafer processing method according to claim 1, wherein said thin film layer to be formed once in said thin film layer forming step has a thickness of 3 to 7 μm, and the predetermined thickness of said die bonding resin film is 30 to 50 μm.

* * * * *